United States Patent [19]

Bowers

[11] Patent Number: 5,323,122

[45] Date of Patent: Jun. 21, 1994

[54] RAPID SLEWING UNITY GAIN BUFFER AMPLIFIER WITH BOOSTED PARASITIC CAPACITANCE CHARGING

[75] Inventor: Derek F. Bowers, Sunnyvale, Calif.

[73] Assignee: Analog Devices, Inc., Norwood, Mass.

[21] Appl. No.: 145,820

[22] Filed: Nov. 2, 1993

[51] Int. Cl.$^5$ ............................................. H03F 3/26
[52] U.S. Cl. ....................................... 330/263; 330/267
[58] Field of Search ............... 330/263, 267, 268, 273, 330/274, 292

[56] References Cited

U.S. PATENT DOCUMENTS 5,049,653  9/1991  Smith et al. ......................... 330/267
5,177,451  1/1993  Lehmann ............................. 330/267

OTHER PUBLICATIONS

PMI Data Book, *Precision Analog Integrated Circuits,* 1988, pp. 5-324 and 5-325.

*Primary Examiner*—Steven Mottola
*Attorney, Agent, or Firm*—Koppel & Jacobs

[57] ABSTRACT

Charging of parasitic capacitances present in a unity gain buffer amplifier is speeded up, with a consequent increase in input slew rate capability, by connecting a resistance circuit across the current sources and output transistors. Imbalances in the response rate of the input transistors to changes in the input voltage produce a current shift through the resistor that charges parasitic capacitances to speed up the output transistor response.

22 Claims, 4 Drawing Sheets

RAPID SLEWING UNITY GAIN BUFFER AMPLIFIER WITH BOOSTED PARASITIC CAPACITANCE CHARGING

BACKGROUND OF THE INVENTION

1. Field of the Invention

This invention relates to unity gain buffer amplifiers, and more particularly to increasing the permissible input slew rate of such amplifiers by charging parasitic capacitances associated with the amplifier circuitry.

2. Description of the Related Art

Unity gain buffer amplifiers have been in use for applications such as the input stage for current feedback operational amplifiers, and stand-alone buffers. A simplified schematic diagram of such a circuit, used in the OP260 dual high-speed current-feedback operational amplifier by the PMI division of Analog Devices, Inc., the assignee of the present invention, is shown in FIG. 1. It includes an input branch with input bipolar transistors Q1 and Q2, which are respectively npn and pnp devices. An input terminal T1 is connected to the bases of each of the input transistors. The collector of Q1 is connected to a positive voltage bus V+, with a current source I1 drawing current from the emitter of Q1 to a negative voltage bus V−; the collector of Q2 is connected to V−, with another current source I2 supplying the Q2 emitter with current from V+. The current sources are typically transistors biased to supply about 0.5 mA, while the absolute voltage levels of the voltage buses can range from about 5 to about 15 volts.

An output branch consisting of series-connected npn and pnp transistors Q3 and Q4 is connected between V+ and V−, with an output terminal T2 taken from the common connection of the Q3, Q4 emitters. The base of Q3 is supplied with current from I2, while current is drawn from the base of Q4 by I1. The emitters of Q1 and Q2 are connected respectively to the bases of Q4 and Q3 by connector lines 2 and 4. The amplifier's unity gain between T1 and T2 results from the rough balancing of the base-emitter voltage drops across Q1 and Q4, and across Q2 and Q3.

The slew rate (the rate at which the circuit responds to a change in the input voltage) of the amplifier as described thus far is limited due to the presence of parasitic capacitances in the circuit, illustrated as capacitances $C_{p1}$ and $C_{p2}$ at the bases of Q3 and Q4, respectively. These parasitic capacitances result mainly from the collector-base capacitances of Q3 and Q4, the collector-base and collector-substrate capacitances of I1 and I2 (which are typically implemented by current source transistors), and metallization capacitances. The slew rate for a positive-going input signal at T1 is limited to $I2/C_{p1}$, while the slew rate for a negative-going input signal is limited to $I1/C_{p2}$. Simply making I1 and I2 larger would not be effective in speeding up the slew rate, since it would impose excessive currents upon Q1–Q4.

Instead of attempting to increase I1 and I2, current boosting npn and pnp bipolar transistors Q5 and Q6 are added in the OP260 device, each with its base connected to the input terminal T1. The base-emitter circuit of Q5 transmits current from V+ to the parasitic capacitance $C_{p1}$, while the collector-emitter circuit of Q6 conducts current away from $C_{p2}$ to V−. Q5 is gated into conduction when the input voltage at T1 is greater than about 2 base-emitter voltage drops (about 1.2 volts) greater than the output voltage at T2, while Q6 is gated into conduction when the input voltage drops more than about 2 base-emitter voltage drops below the output voltage. When gated, Q5 provides for a more rapid charging of $C_{p1}$, while Q6 increases the negative charging (i.e., the discharge) rate for $C_{p2}$.

While the addition of Q5 and Q6 provides a gross improvement in the input slew rate, it does not speed up the circuit operation for small signal levels. In fact, the circuit response for small signals is actually slower because of additional stray capacitances introduced by Q5 and Q6.

SUMMARY OF THE INVENTION

The present invention seeks to provide a unity gain buffer amplifier with a capacity for rapidly charging parasitic capacitances, with a corresponding increase in slew rate capability, that is operative for both small and large input signal levels and does not itself introduce significant additional capacitances.

These goals are achieved by taking advantage of the fact that, when the input voltage changes, the base-emitter circuit of the input transistor that is gated to a more conductive state rapidly tracks the change in input voltage, whereas the response of the base-emitter circuit of the other input transistor that is gated to a less conductive state significantly lags behind the first transistor. A resistance circuit is connected across the base inputs to the two output transistors, and provides a rapid charging path for the parasitic capacitances. During the transient period when the input voltage is changing and only one of the input transistors has yet tracked the change, the imbalance between the input transistor voltages is impressed across the resistance circuit and produces a corresponding current. This current rapidly charges the parasitic capacitance at the output transistor which is gated by the lagging input transistor.

The invention is applicable to numerous different buffer amplifier designs. A current compensation circuit is preferably provided to compensate for the current which the resistance circuit diverts from the input transistors. In a preferred embodiment, with current sources of about 1.5 mA, the resistance circuit is implemented as a resistor of about 1.2 kohms.

These and other features and advantages of the invention will be apparent to those skilled in the art from the following detailed description, taken together with the accompanying drawings.

DETAILED DESCRIPTION OF THE INVENTION

Figure 2:
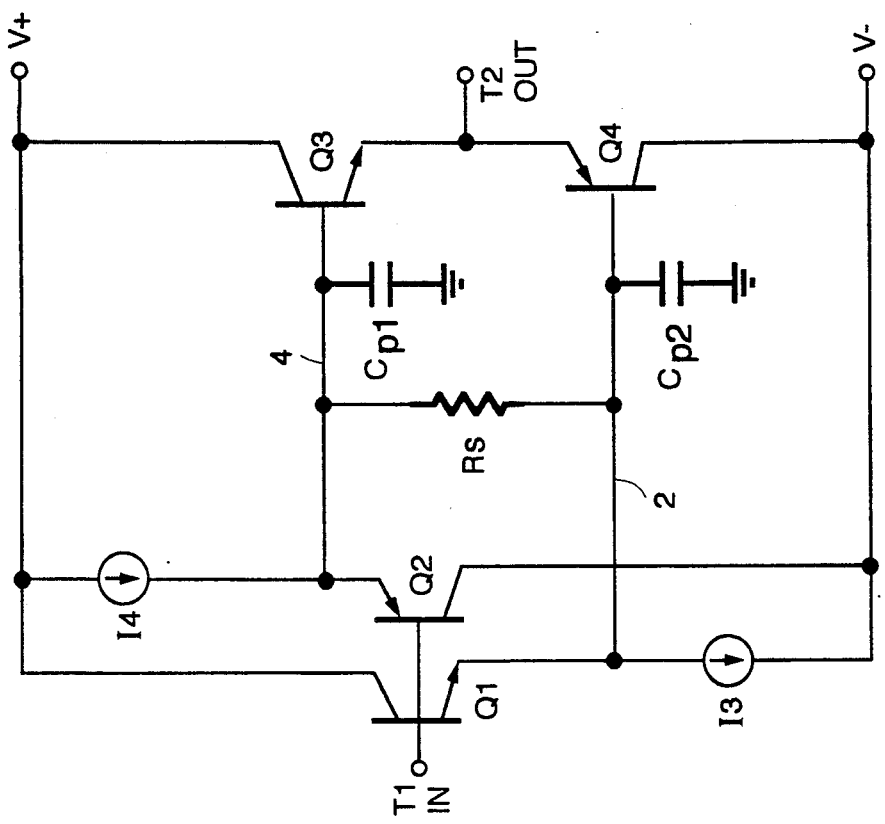
FIG. 2 is a schematic diagram showing a basic amplifier circuit which uses the invention.

FIG. 2 shows a basic unity gain buffer amplifier circuit that uses the present invention to significantly improve its input slew rate capability over a wide range of input signals, including both high and low level signals. It is similar to the prior circuit illustrated in FIG. 1. However, instead of the charging transistors Q5 and Q6, a simple resistance circuit, preferably consisting of a single resistor Rs, is connected between current sources I3 and I4 across the base inputs to output transistors Q3 and Q4. The addition of this resistor results in a rapid charging of whichever parasitic capacitance would otherwise tend to restrict the input slew rate.

Figure 1:
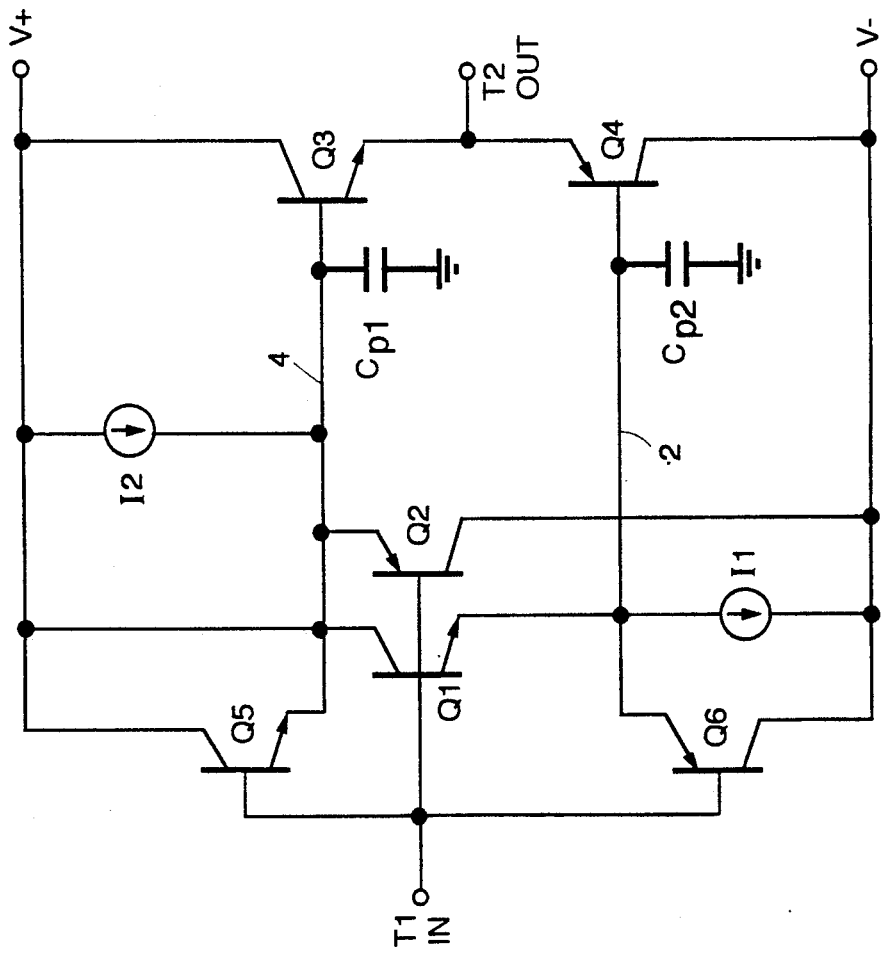
FIG. 1 is a schematic diagram of a prior unity gain buffer amplifier, described above.

In FIG. 2 the same reference numerals are used as in FIG. 1 to refer to the same elements. Note, however, that instead of the current sources I1 and I2 in FIG. 1, different current sources I3 and I4 are employed in FIG. 2. I3 and I4 are larger than I1 and I2 by an amount that compensates for the current which Rs diverts away from the input transistors Q1 and Q2. In a preferred embodiment Rs is approximately 1.2 kohm. With a base-emitter voltage of approximately 0.6 volts for both Q1 and Q2, the total voltage across Rs will normally be about 1.2 volts, resulting in a current of about 1 mA through Rs. Thus, to maintain currents of about 0.5 mA through the input transistors, I3 and I4 are each about 1.5 mA.

To understand the operation of the resistor Rs in enhancing the input slew rate, first consider the situation when the input signal at T1 is rapidly increasing in a positive direction. In this situation input transistor Q1 becomes more conductive, and its emitter voltage rapidly tracks the input base voltage (subject to a base-emitter voltage differential of about 0.6 volts). The rising voltage at the Q1 emitter rapidly charges the parasitic capacitance $C_{p2}$ and makes the output transistor Q4 less conductive. Input transistor Q2, on the other hand, is driven to a less conductive state. Accordingly, its emitter voltage lags behind the increase in its base voltage; this retards the charging of parasitic capacitance $C_{p1}$, and thereby prevents an increase in the base voltage for output transistor Q3. As a result, an increase in conductivity for Q3 significantly lags behind that of Q1, and the output voltage at T2 cannot rise by the desired amount closer to V+ until the effects of the parasitic capacitance $C_{p1}$ have been overcome.

The addition of Rs changes this situation dramatically. In steady state, a voltage differential of about 1.2 volts is applied across Rs due to the base-emitter voltages of Q1 and Q2, and a current of about 1 mA flows through Rs. When both the input voltage at T1 and the emitter voltage of Q1 have risen, but before the emitter voltage of Q2 has responded to the increase in voltage, the voltage across Rs drops by an amount equal to the base-emitter voltage imbalance between Q1 and Q2. In effect, a transient current shift takes place in which transient current flows from the emitter node of Q1, up through Rs and into the parasitic capacitance $C_{p1}$. This charging of the parasitic capacitance through Rs results in a much faster operation for the output transistor Q3, and accordingly a more rapid tracking between the input and output voltages at T1 and T2. For large input voltage swings the voltage at the emitter of Q1 can temporarily rise considerably above the Q2 emitter voltage, and the reverse current through Rs that charges the parasitic capacitance $C_{p1}$ can considerably exceed the magnitudes of the current sources I3 and I4.

The circuit operates in a symmetrical fashion for negative-going swings in the input voltage. A rapid drop in the input voltage causes Q2 to become more conductive, with its emitter voltage rapidly tracking the input voltage shift. Input transistor Q1, on the other hand, becomes less conductive, and the response of its emitter voltage lags behind that of Q2. The parasitic capacitance $C_{p1}$ is thus rapidly discharged, while the parasitic capacitance $C_{p2}$ at the base of Q4 is not. The drop in the Q2 emitter voltage results in a reduction in the current through Rs which discharges the parasitic capacitance $C_{p2}$, allowing output transistor Q4 to respond more rapidly to the shift in input voltage than would otherwise be the case.

Unlike the speedup transistors Q5 and Q6 of FIG. 1, which operate independent of the input transistors Q1 and Q2, the present invention uses the input transistors along with Rs as an integral part of the parasitic capacitance charging. Furthermore, Rs adds little stray capacitance, especially if it is implemented as a film resistor. Although theoretically either thick film or thin film resistors could be used, integrated circuits typically employ thin film resistors.

As mentioned above, the resistor Rs diverts a portion of the I3, I4 current away from Q1 and Q2. The current diversion is particularly severe at low temperatures, at which the transistor base-emitter voltages are higher. There are numerous ways to design a current compensation circuit that compensates for the diverted current; a preferred circuit is illustrated in FIG. 3.

Figure 3:
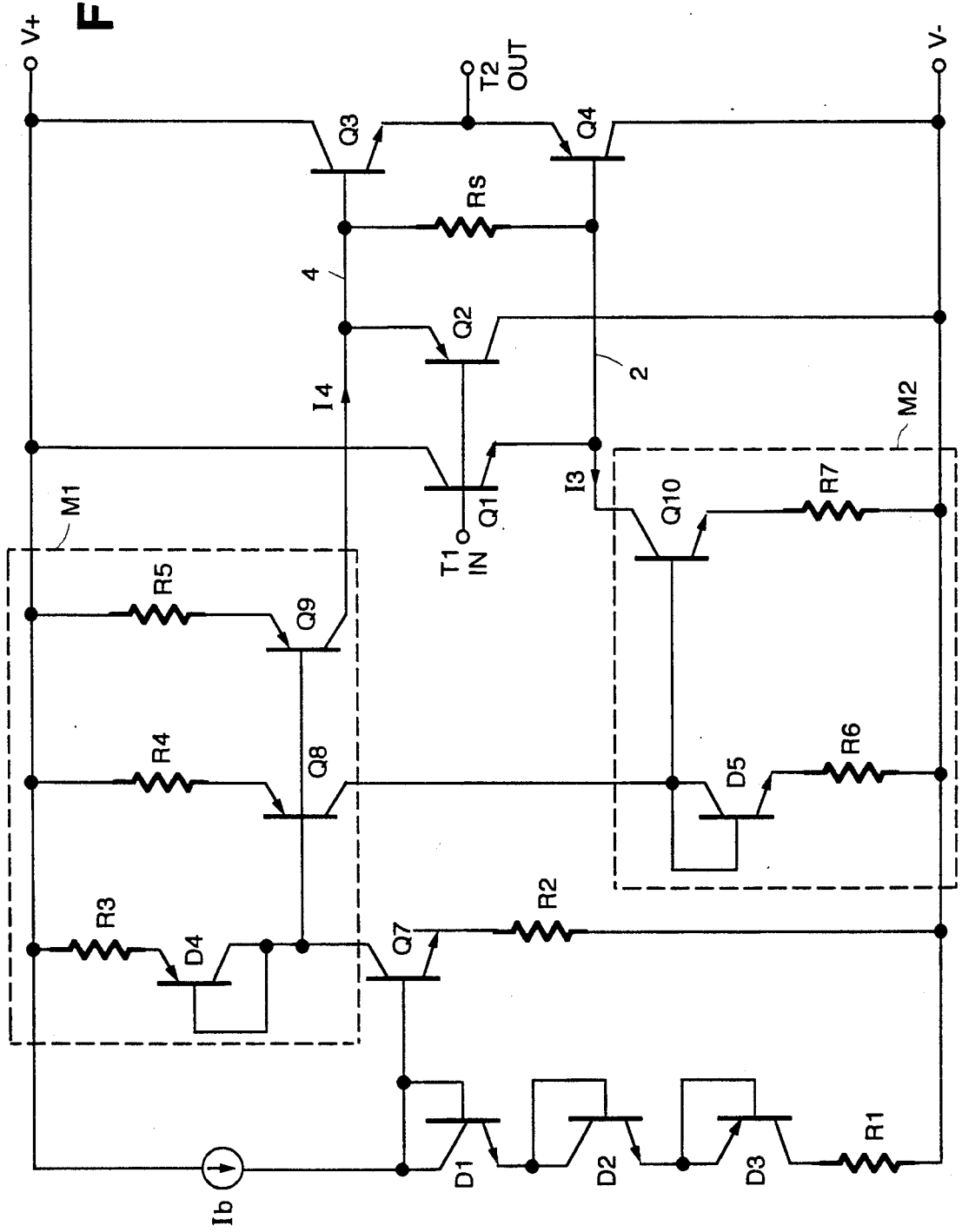
FIG. 3 is a schematic diagram of the amplifier circuit shown in FIG. 2, with a current compensation circuit employed for the current sources.

In FIG. 3 the current compensation circuit includes a bias current source Ib that directs a current from V+ through three series-connected diodes D1, D2 and D3, and a resistor R1 connected between D3 and V−. The diodes are implemented in the usual fashion as bipolar transistors with their bases and collectors connected together. D2 and D3 have scalings similar to Q3 and Q4. The base/collector of D1 provides a base bias for another bipolar transistor Q7. The emitter of Q7 is connected to V− through a resistor R2, while the collector of Q7 is connected to V+ through a series-connected resistor R3 and diode D4 to provide a reference current for a first current mirror M1. The Q7 collector is also connected to provide a base bias for pnp bipolar transistors Q8 and Q9, whose currents proportionately mirror the current through the R3/D4/Q7/R2 circuit. The collectors of Q8 and Q9 are connected to V+ through resistors R4 and R5, respectively.

The collector of Q9 is connected directly to the emitter of input transistor Q2, the base of output transistor Q3 and Rs furnishing the current I4. The collector of Q8, on the other hand, provides a reference current for a second current mirror M2 which sets up the I3 current. Current mirror M2 consists of an npn diode D5 connected in series with a resistor R6 between the Q8 collector and V−, and an npn bipolar transistor Q10 having its base connected to the Q8 collector, its emitter connected through a resistor R7 to V−, and its collector connected to the emitter of input transistor Q1, the base of output transistor Q4 and the other side of Rs from I4.

The reference current through Q7 for the first current mirror M1 is approximately equal to $$\frac{R1}{R2} Ib + \frac{V_{beD2} + V_{beD3}}{R2},$$

where $V_{beD2}$ and $V_{beD3}$ are the base-emitter voltages for npn diode D2 and pnp diode D3, respectively. The collector currents of Q8 and Q9 are proportional to the collector current of Q7, depending upon the transistor scalings. With equal scalings in both current mirrors, I3 and I4 will both be equal to the collector current of Q7.

Figure 4:
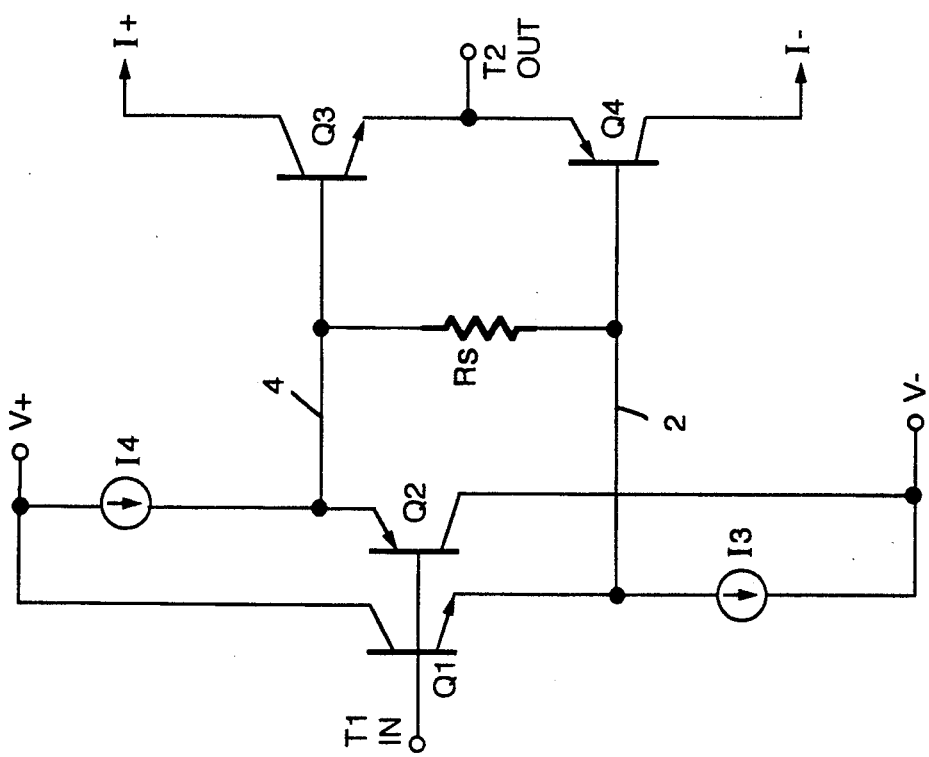
FIG. 4 is a schematic diagram of an amplifier circuit similar to FIG. 2, but with positive and negative current outputs.

The invention is applicable to numerous different unity gain buffer amplifier circuits. FIG. 4 shows one variation that can be used for both the basic circuit of FIG. 2, and for the variations described below in connection with FIGS. 5, 6 and 7. In the FIG. 4 circuit the collectors of output transistors Q3 and Q4 provide complementary current outputs I+ and I−, rather than being tied to V+ and V−. The major application for this configuration is in current feedback and transconductance amplifiers. The function of resistor Rs in enhancing the input slew rate is the same as in the FIG. 2 circuit. The provision of complementary current outputs from a unity gain buffer amplifier is known per se, but not in connection with the improvement provided by the present invention.

Figure 5:
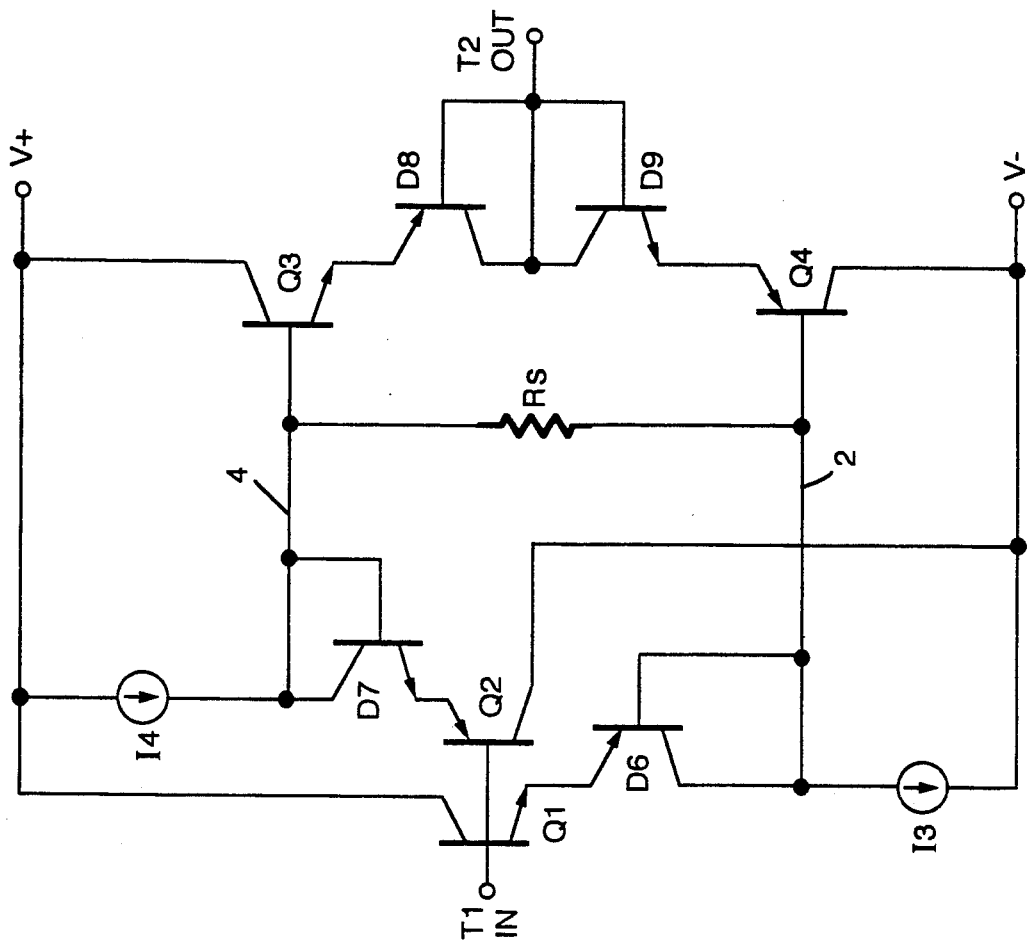
FIG. 5 is a schematic diagram of a variation of the FIG. 2 circuit in which diodes are added to improve the input/output offset voltage.

Referring now to FIG. 5, another embodiment that achieves an improved input/output offset voltage is shown. In this circuit, a pnp diode D6 is connected between the emitter of Q1 and the base of Q4, which an npn diode D7 is connected between the emitter of Q2 and base of Q3. Additional pnp and npn diodes D8 and D9 are connected respectively between the emitters of Q3 and Q4 and the output terminal T2.

With the FIG. 5 circuit, the input voltage experiences two base-emitter drops through npn Q1 and pnp D6, and then two base-emitter increases through pnp Q4 and npn D9, in setting the output voltage at T2. Similarly, the input-output path through Q2 and Q3 also includes two base-emitter voltage increases and two drops through a pair of npn and a pair of pnp devices. Since the base-emitter voltage for an npn transistor will normally differ somewhat from that of a pnp transistor, this configuration eliminates a difference in base-emitter voltages inherent in the FIG. 2 circuit. A similar configuration, without the speedup resistor Rs, is used in the OP260 operational amplifier mentioned above. It should be noted that this circuit doubles the voltage across Rs. The value of the resistance element can be doubled to preserve the current levels described above.

Figure 6:
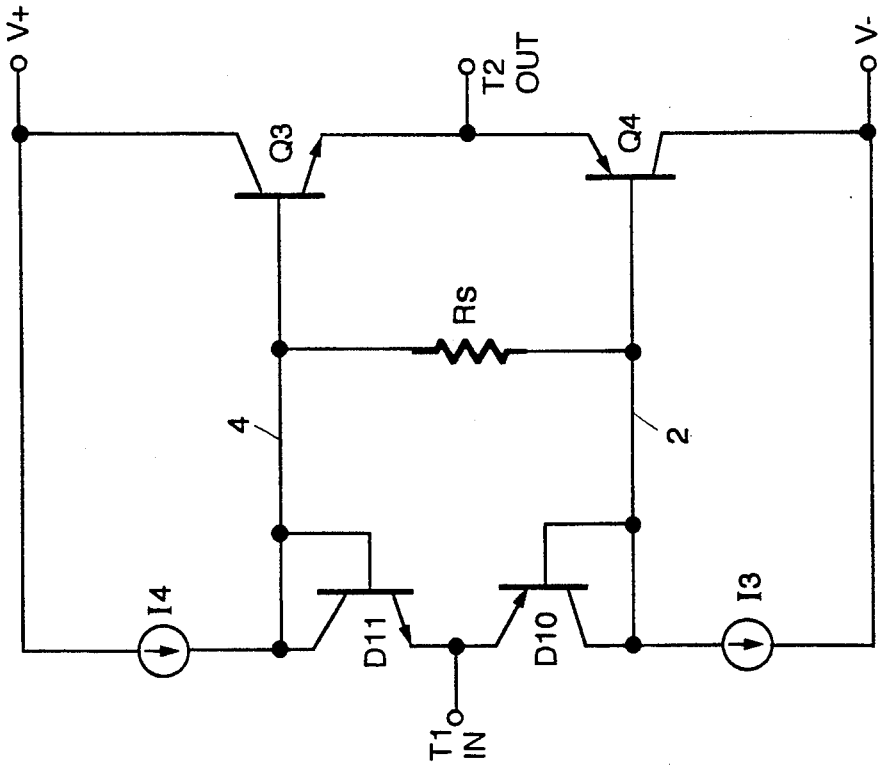
FIG. 6 is a schematic diagram of another variation in the buffer amplifier circuit that employs diode inputs.

Another circuit variation that improves the input offset voltage is shown in FIG. 6. This circuit is similar to FIG. 2, except diode-connected pnp and npn transistors D10 and D11 are used instead of Q1 and Q2 with the input terminal T1 connected to the emitters rather than the bases of D10 and D11, and the base/collectors of Q10 and Q11 connected respectively to the bases of Q4 and Q3. A similar configuration is employed in the AD-811 operational amplifier by Analog Devices, Inc., but without the speedup resistor Rs. A disadvantage of this circuit is that it increases the input current, since mismatches between I3 and I4 must now flow through the input terminal.

Figure 7:
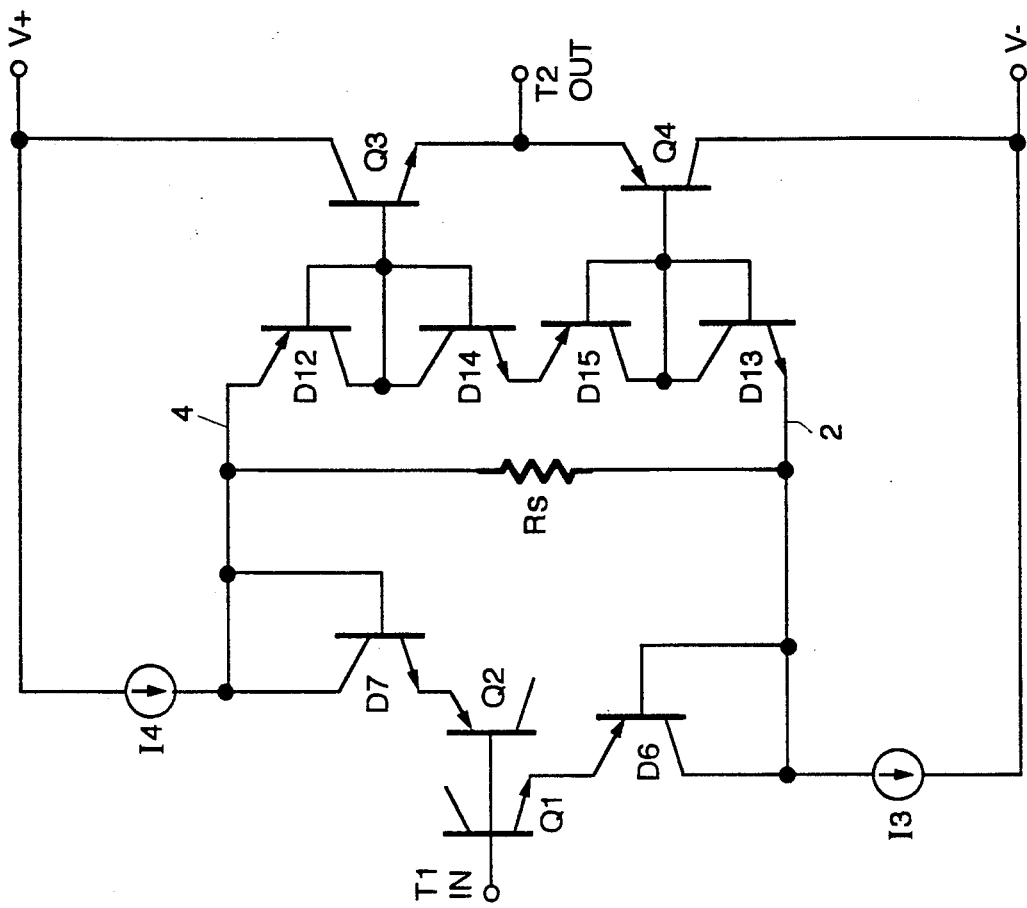
FIG. 7 is a schematic diagram of a circuit similar to FIG. 5, but with a lower output impedance.

Another amplifier configuration to which the invention is applicable is illustrated in FIG. 7. This circuit is somewhat similar to FIG. 5, but achieves a lower output impedance by leaving the collectors of input transistors Q1 and Q2 disconnected from the rest of the circuit, retaining diodes D6 and D7, and reconfiguring the output branch. In the new output branch, pnp diode D12 and npn diode D13 have their base/collectors connected respectively to the bases of output transistors Q3 and Q4, and their emitters connected respectively to the base/collectors of D7 and D6. Another pair of npn and pnp diodes D14 and D15 is connected in series from the base of Q3 to the base of Q4. In this configuration the resistor Rs is connected to the bases of Q3 and Q4 through diodes D12 and D13, respectively, rather than directly as in the previous circuits. However, Rs is still connected directly between I3 and I4.

As with the FIG. 5 circuit, Rs in FIG. 7 has twice the voltage impressed across it as in FIG. 2, and should likewise be doubled if it is desired to preserve the current levels. The general approach illustrated in FIG. 7 is known, but again not in connection with the speedup resistance circuit of the invention.

While several embodiments of a rapid slewing unity gain buffer amplifier have been shown and described, numerous variations and alternate embodiments will occur to those skilled in the art. Accordingly, it is intended that the invention be limited only in terms of the appended claims.

I claim:
1. A buffer amplifier, comprising:
   an input terminal for receiving an input voltage,
   an output terminal,
   an input branch that is connected to said input terminal and includes first and second non-symmetrical input voltage follower circuit elements, the first and second input elements respectively producing first and second bias voltages that track the input voltage, the voltage tracking of said input elements having non-symmetrical response times to changes in the input voltage, with the first input element responding more quickly than the second input element to increases in the input voltage, and the second input element responding more quickly than the first input element to decreases in the input voltage,
   an output branch that is connected to said output terminal and includes first and second output circuit elements which have inputs that are respectively biased by said first and second bias voltages to control the output voltage at said output terminal, said amplifier being characterized by parasitic capacitances at the inputs to said output circuit elements which limit the amplifier's input voltage slew rate, and
   a resistance circuit connected between the inputs to said first and second output circuit elements to provide a transient charging current path from said bias voltages to said parasitic capacitances during the interval between one of said input elements responding to a change in the input voltage and the other input element responding to said input voltage change.

2. The buffer amplifier of claim 1, further comprising first and second current sources supplying currents to said first and second input elements, respectively, with said resistor circuit connected between said current sources.

3. The buffer amplifier of claim 2, wherein said current sources each supply about 1.5 mA, and said resistance circuit has a resistance of about 1.2 kohms.

4. The buffer amplifier of claim 2, wherein said resistance circuit diverts current from said current sources away from said first and second input elements, further comprising a current compensation circuit connected to supply said first and second input elements with currents that compensate for the diverted current.

5. The buffer amplifier of claim 1, wherein said resistor circuit comprises a thin film resistor.

6. The buffer amplifier of claim 1, wherein said first input element comprises an input npn bipolar transistor, said second input element comprises an input pnp bipolar transistor, and said first output element comprises an output npn bipolar transistor, and said second output element comprises an output pnp bipolar transistor, with said input terminal connected to the bases of both of said input transistors and said output terminal connected between the collector-emitter circuits of said output transistors.

7. The buffer amplifier of claim 6, further comprising a diode-connected pnp bipolar transistor connected to the emitter of said first input transistor, a diode-connected npn bipolar transistor connected to the emitter of said second input transistor, a diode-connected pnp bipolar transistor connected to the emitter of said first output transistor, and a diode-connected npn bipolar transistor connected to the emitter of said second output transistor, said diodes reducing the amplifier's input-output offset voltage.

8. The buffer amplifier of claim 6, further comprising a first diode-connected pnp bipolar transistor connected to the emitter of said first input transistor, a first diode-connected npn bipolar transistor connected to the emitter of said second input transistor, with the collectors of said input transistors left open, a second diode-connected pnp bipolar transistor connected between the base of said first diode-connected npn transistor and the base of said output npn transistor, a second diode-connected npn bipolar transistor connected between the base of said first diode-connected pnp transistor and the base of said output pnp transistor, and third diode-connected npn and pnp bipolar transistors connected in series from the base of said npn output transistor to the base of said pnp output transistor, with said resistance circuit connected between the bases of said output transistors through said second diode-connected transistors.

9. The buffer amplifier of claim 1, wherein said first and second input elements respectively comprise diode-connected npn and pnp bipolar transistors having their emitters connected to said input terminal, and said first and second output elements respectively comprise an npn bipolar transistor having its base connected to the base of said first input element and its emitter connected to said output terminal, and a pnp bipolar transistor having its base connected to the base of said second input element and its emitter connected to said output terminal.

10. A buffer amplifier, comprising:
an input terminal for receiving an input voltage,
an output terminal,
a positive voltage bus,
a negative voltage bus,
input npn and pnp bipolar transistors having their base-emitter circuits connected to said input terminal,
first and second current sources connected to induce current flows between the collector-emitter circuits of each of said input transistors and at least one respective voltage bus,
output npn and pnp transistors having their base-emitter circuits connected to said output terminal, and parasitic capacitances at their bases which limit the amplifier's voltage slew rate,
connector circuits interconnecting said input and output transistors such that the voltage at said output terminal tracks the voltage at said input terminal, and
a resistance circuit connected between the bases of said output transistors to provide transient charging current paths for said parasitic capacitances from said input transistors during slewing of the input voltage.

11. The buffer amplifier of claim 10, wherein said current sources each supply about 1.5 mA, and said resistance circuit has a resistance of about 1.2 kohms.

12. The buffer amplifier of claim 10, wherein the bases of said input transistors are connected to said input terminal, said first current source supplies current from said positive voltage bus to the emitter of said pnp input transistor and the base of said output npn transistor, and said second current source draws current from the emitter of said npn input transistor and the base of said output pnp transistor to said negative voltage bus.

13. The buffer amplifier of claim 12, wherein said resistance circuit is also connected between the emitters of said input transistors.

14. The buffer amplifier of claim 12, said connector circuits comprising first diode-connected npn and pnp bipolar transistors connected respectively between the base of said output npn transistor and the emitter of said input pnp transistor, and the base of said output pnp transistor and the emitter of said input npn transistor, and second diode-connected npn and pnp bipolar transistors connected between said output terminal and the emitters of said npn and pnp output transistors, respectively.

15. The buffer amplifier of claim 12, said connector circuits comprising first diode-connected npn and pnp bipolar transistors with their emitters connected to the emitters of said input pnp and npn transistors, respectively, with the collectors of said input transistors left open, second diode-connected npn and pnp bipolar transistors with their emitters connected to the emitters of said first diode-connected pnp and npn transistors, respectively, and their bases connected respectively to the bases of said output pnp and npn transistors, and third diode-connected npn and pnp bipolar transistors connected in series from the base of said npn output transistor to the base of said pnp output transistor, with said resistance circuit connected between the bases of said output transistors through said second diode-connected transistors.

16. The buffer amplifier of claim 10, wherein said input transistors are diode-connected with their emitters connected to said input terminal, and their bases and collectors connected to said connector circuits.

17. The buffer amplifier of claim 10, wherein the collectors of said input npn and pnp transistors are connected respectively to said positive and negative voltage buses.

18. The buffer amplifier of claim 10, wherein the collectors of said output npn and pnp transistors are connected respectively to said positive and negative voltage buses.

19. The buffer amplifier of claim 10, wherein the collectors of said output npn and pnp transistors are connected to provide respective current outputs from said amplifier.

20. The buffer amplifier of claim 10, wherein said resistance circuit diverts current from said current sources away from said input transistors, further comprising a current compensation circuit connected to supply said input transistors with currents that compensate for the diverted current.

21. A buffer amplifier, comprising:
an input terminal for receiving an input voltage,
an output terminal,
a positive voltage bus,
a negative voltage bus,
input npn and pnp bipolar transistors having their base-emitter circuits connected to said input terminal,
first and second current sources connected to induce current flows between the collector-emitter circuits of each of said input transistors and at least one respective voltage bus,
output npn and pnp transistors having their base-emitter circuits connected to said output terminal,
connector circuits interconnecting said input and output transistors such that the voltage at said output terminal tracks the voltage at said input terminal, and
a resistance circuit connected between said current sources to provide transient charging current paths for parasitic capacitances during slewing of the input voltage.

22. The buffer amplifier of claim 21, wherein said current sources each supply about 1.5 mA, and said resistance circuit has a resistance of about 1.2 kohms.

* * * * *